(12) United States Patent
Watanabe et al.

(10) Patent No.: US 7,390,732 B1
(45) Date of Patent: Jun. 24, 2008

(54) METHOD FOR PRODUCING A SEMICONDUCTOR DEVICE WITH PYRAMIDAL BUMP ELECTRODES BONDED ONTO PAD ELECTRODES ARRANGED ON A SEMICONDUCTOR CHIP

(75) Inventors: Takayoshi Watanabe, Fujisawa (JP);
Hidetaka Shigi, Kanagawa-ken (JP);
Susumu Kasukabe, Yokohama (JP);
Terutaka Mori, Urayasu (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/462,796

(22) PCT Filed: Jul. 15, 1998

(86) PCT No.: PCT/JP98/03177

§ 371 (c)(1),
(2), (4) Date: Jan. 13, 2000

(87) PCT Pub. No.: WO99/04424

PCT Pub. Date: Jan. 28, 1999

(30) Foreign Application Priority Data

Jul. 15, 1997 (JP) .................................. 9-189660

(51) Int. Cl.
*H01L 21/44* (2006.01)

(52) U.S. Cl. .................. 438/612; 438/613; 438/614; 257/E23.021

(58) Field of Classification Search ............... 257/737, 257/778, 750, 773, 785, 780; 438/612–614, 438/616–617; 228/254, 180.22, 248.1
See application file for complete search history.

(56) References Cited

U.S. PATENT DOCUMENTS

| | | | |
|---|---|---|---|
| 5,027,188 A * | 6/1991 | Owada et al. ................ 357/68 |
| 5,508,561 A * | 4/1996 | Tago et al. .................. 257/737 |
| 5,527,734 A | 6/1996 | van der Putten |
| 5,592,736 A * | 1/1997 | Akram et al. ................ 29/842 |
| 5,643,831 A * | 7/1997 | Ochiai et al. ............... 438/616 |
| 6,049,130 A * | 4/2000 | Hosomi et al. .............. 257/750 |
| 6,172,422 B1 * | 1/2001 | Chigawa et al. ............. 257/778 |
| 6,232,211 B1 * | 5/2001 | Tsukahara .................. 438/612 |
| 6,271,110 B1 * | 8/2001 | Yamaguchi et al. ......... 438/613 |
| 2001/0054771 A1 * | 12/2001 | Wark et al. ................. 257/786 |

FOREIGN PATENT DOCUMENTS

| | | |
|---|---|---|
| EP | 0 479 373 A1 | 4/1992 |
| JP | 57207362 | 12/1982 |
| JP | 64081344 | 3/1989 |
| JP | 04164342 | 6/1992 |
| JP | 4292803 | 10/1992 |
| JP | 05-121409 * | 5/1993 |
| JP | 6-268201 | 9/1994 |
| JP | 08148491 | 6/1996 |
| JP | 8-191072 | 7/1996 |
| JP | 09-017794 A | 1/1997 |
| JP | 09115913 | 5/1997 |
| JP | 09-172021 A | 6/1997 |
| JP | 09172021 | 6/1997 |
| JP | 10-163251 A | 6/1998 |

* cited by examiner

*Primary Examiner*—Thanh Nguyen
(74) *Attorney, Agent, or Firm*—Mattingly, Stanger, Malur & Brundidge, P.C.

(57) ABSTRACT

A semiconductor device capable of facilitating high density mounting at low cost without causing any defective conduction at the time of connection to a substrate, a mounting structure thereof and a method of fabrication thereof, characterized in that pyramidal bump electrodes are bonded onto pad electrodes arranged on a semiconductor chip to form the semiconductor device.

29 Claims, 6 Drawing Sheets

METHOD FOR PRODUCING A SEMICONDUCTOR DEVICE WITH PYRAMIDAL BUMP ELECTRODES BONDED ONTO PAD ELECTRODES ARRANGED ON A SEMICONDUCTOR CHIP

TECHNICAL FIELD

The present invention relates to the packaging technology for semiconductor chips, and particularly to a semiconductor device with pyramidal bump electrodes formed at a high density on a semiconductor chip so that the chip can be mounted on a substrate, a mounting structure thereof and a method of fabrication thereof.

BACKGROUND ART

The integration of semiconductor devices such as a microcomputer has been increased to have more functions and more elements formed at a higher density. The number of terminals to the external circuits has been rapidly increased, and the circuit wiring conductors become complicated. Therefore, the wire-bonding type connection in which the bonding pads provided on the periphery of each semiconductor chip are connected to the external circuits by wire bonding has already reached its limit. In addition, since the wire-bonding type connection forces the internal wiring conductors to run about up to the peripheral bonding pads, the lengths of the wiring conductors are increased, making the signal transmission slow down. Thus, this type of connection is not suited to the mounting of the logic LSI that needs high-speed operation. For the above reasons, how to much reduce the internal connection regions is the key. In this respect, the flip-chip type connection is a promising technique capable of limiting the connection regions to the top of the chip. Since this flip-chip connection enables the terminals to be provided not only on the periphery of the chip but also on the internal regions thereof, the number of pins of the chip can be increased. In addition, since the flip-chip type allows the wiring conductors on the chip to be short as compared with the wire-bonding type, the operation speed of the logic LSI can be increased.

A conventional method for flip-chip type connection by providing pyramidal bump electrodes on chips is disclosed in JP-A-6-268201.

In the conventional flip-chip type connection by the projected bump electrodes formed on chips, the cut-off separated semiconductor chips themselves are placed under severe conditions of photolithographic process, multi-layer metalization process and heat treatment process for melting solder. In addition, since it takes a long time to finish these processes, some of the separated good chips are defective under the severe conditions or the yield of good chips is reduced by misoperation. The need of these processes increases the production cost because these processes reduce the productivity and do not lead to economy. That is, in the conventional method for mounting by use of the projected bump electrodes formed on the semiconductor chips that are cut off from a wafer, the good semiconductor chips are placed several times under severe conditions, and many different processes that take a long time follow, complicating the production process. This results in the reduction of the yield. In addition, when the projected bump electrodes are formed by melting solder in this conventional method, the heights of the electrodes are so irregular that some electrodes cannot be connected to the conductor pads on the substrate.

It is an object of the invention to provide a semiconductor device capable of high-density mounting without causing any defective conduction at the time of connecting to the substrate, and a mounting structure thereof.

It is another object of the invention to provide a semiconductor device for facilitating high-density mounting at low cost without causing any defective conduction at the time of connecting to the substrate, and a mounting structure thereof.

It is still another object of the invention to provide a method of producing a semiconductor device at low cost by connecting novel projected bump electrodes onto the pad electrodes of the semiconductor chip with the production process simplified.

DISCLOSURE OF INVENTION

In order to achieve the above objects, according to the invention, there is provided a semiconductor device having a plurality of projected bump electrodes including pyramidal bumps electrodes of a quadrilateral pyramid shape or the like bonded onto pad electrodes arranged on a semiconductor chip.

Also, according to the invention, there is provided a semiconductor device having a plurality of pyramidal bump electrodes of a quadrilateral pyramid shape or the like bonded through an anisotropic conduction film onto pad electrodes arranged on a semiconductor chip.

In addition, according to the invention, there is provided a semiconductor device having a plurality of pyramidal bump electrodes of a quadrilateral pyramid shape or the like bonded by thermal compression onto pad electrodes arranged on a semiconductor chip.

Moreover, according to the invention, there is provided a semiconductor device having a plurality of pyramidal bump electrodes of a quadrilateral pyramid shape or the like respectively bonded by thermal compression onto pad electrodes arranged on a semiconductor chip so that the pyramidal bump electrodes and the pad electrodes can form an alloy at the junctions by the thermal compression.

In the above semiconductor devices, a base material of the pyramidal bump electrodes is made of hard nickel, Ni.

Moreover, in the above semiconductor devices, a base material of the pyramidal bump electrodes is made of soft copper, Cu.

According to the invention, there is provided a mounting structure in a semiconductor device having a plurality of pyramidal bump electrodes of a quadrilateral pyramid shape or the like respectively bonded onto pad electrodes arranged on a semiconductor chip, the mounting structure enabling the semiconductor device to be mounted on a substrate by respectively bonding the pyramidal bump electrodes onto terminals formed on the substrate.

In addition, according to the invention, there is provided a mounting structure in a semiconductor device having a plurality of pyramidal bump electrodes of a quadrilateral pyramid shape or the like respectively bonded through an anisotropic conduction film onto pad electrodes arranged on a semiconductor chip, the mounting structure enabling the semiconductor device to be mounted on a substrate by respectively bonding the pyramidal bump electrodes onto terminals formed on the substrate.

Also, according to the invention, there is provided a mounting structure in a semiconductor device having a plurality of pyramidal bump electrodes of a quadrilateral pyramid shape or the like respectively bonded by thermal compression onto pad electrodes arranged on a semiconductor chip, the mounting structure enabling the semiconductor device to be mounted on a substrate by respectively bonding the pyramidal bump electrodes onto terminals formed on the substrate.

Also, according to the invention, there is provided a mounting structure in a semiconductor device having a plurality of pyramidal bump electrodes of a quadrilateral pyramid shape or the like respectively bonded by thermal compression onto pad electrodes arranged on a semiconductor chip so that the pyramidal bump electrodes and the pad electrodes can form an alloy at the junctions by the thermal compression, the mounting structure enabling the semiconductor device to be mounted on a substrate by respectively bonding the pyramidal bump electrodes onto terminals formed on the substrate.

Also, according to the invention, there is provided a mounting structure in a semiconductor device having a plurality of pyramidal bump electrodes of a quadrilateral pyramid shape or the like respectively bonded onto pad electrodes arranged on a semiconductor chip, the mounting structure enabling the semiconductor device to be mounted on a substrate by respectively soldering the pyramidal bump electrodes onto terminals formed on the substrate.

In addition, according to the invention, there is provided a mounting structure in a semiconductor device having a plurality of pyramidal bump electrodes of a quadrilateral pyramid shape or the like respectively bonded through an anisotropic conduction film onto pad electrodes arranged on a semiconductor chip, the mounting structure enabling the semiconductor device to be mounted on a substrate by respectively soldering the pyramidal bump electrodes onto terminals formed on the substrate.

Moreover, according to the invention, there is provided a mounting structure in a semiconductor device having a plurality of pyramidal bump electrodes of a quadrilateral pyramid shape or the like respectively bonded by thermal compression onto pad electrodes arranged on a semiconductor chip, the mounting structure enabling the semiconductor device to be mounted on a substrate by respectively soldering the pyramidal bump electrodes onto terminals formed on the substrate.

Moreover, according to the invention, there is provided a mounting structure in a semiconductor device having a plurality of pyramidal bump electrodes of a quadrilateral pyramid shape or the like respectively bonded by thermal compression onto pad electrodes arranged on a semiconductor chip so that the pyramidal bump electrodes and the pad electrodes can form an alloy at the junctions by the thermal compression, the mounting structure enabling the semiconductor device to be mounted on a substrate by respectively soldering the pyramidal bump electrodes onto terminals formed on the substrate.

Also, according to the invention, there is provided a mounting structure in a semiconductor device having a plurality of pyramidal bump electrodes of a quadrilateral pyramid shape or the like respectively bonded onto pad electrodes arranged on a semiconductor chip, the mounting structure enabling the semiconductor device to be mounted on a substrate by respectively bonding the pyramidal bump electrodes onto terminals formed on the substrate and by bonding said semiconductor device to the substrate with an adhesive.

Also, according to the invention, there is provided a mounting structure in a semiconductor device having a plurality of pyramidal bump electrodes of a quadrilateral pyramid shape or the like respectively bonded through an anisotropic conduction film onto pad electrodes arranged on a semiconductor chip, the mounting structure enabling the semiconductor device to be mounted on a substrate by respectively bonding the pyramidal bump electrodes onto terminals formed on the substrate and by bonding the semiconductor device to the substrate with an adhesive.

Moreover, according to the invention, there is provided a mounting structure in a semiconductor device having a plurality of pyramidal bump electrodes of a quadrilateral pyramid shape or the like respectively bonded by thermal compression onto pad electrodes arranged on a semiconductor chip, the mounting structure enabling the semiconductor device to be mounted on a substrate by respectively bonding the pyramidal bump electrodes onto terminals formed on the substrate and by bonding the semiconductor device to the substrate with an adhesive.

In addition, according to the invention, there is provided a mounting structure in a semiconductor device having a plurality of pyramidal bump electrodes of a quadrilateral pyramid shape or the like respectively bonded by thermal compression onto pad electrodes arranged on a semiconductor chip so that the pyramidal bump electrodes and the pad electrodes can form an alloy at the junctions by the thermal compression, the mounting structure enabling the semiconductor device to be mounted on a substrate by respectively bonding the pyramidal bump electrodes onto terminals formed on the substrate and by bonding the semiconductor device to the substrate with an adhesive.

In the above mounting structures, a base of the pyramidal bump electrodes in said semiconductor device is made of hard nickel, Ni.

Also, in the above mounting structures, a base of the pyramidal bump electrodes in said semiconductor device is made of soft copper, Cu.

According to the invention, there is also provided a method of producing a semiconductor device comprising the steps of forming, by photolithographic etching, pyramidal holes in a base having a particular crystal orientation plane in order to oppose a plurality of pad electrodes arranged on a semiconductor chip, forming on the base a pattern of an organic material according to the pyramidal holes formed by the pyramidal hole creating step, filling up a conductive material through the pattern in the pyramidal holes formed by the pyramidal hole creating step and then removing the pattern of the organic material to form pyramidal bump electrodes, bonding the pyramidal bump electrodes onto the pad electrodes arranged on the semiconductor chip, and separating the pyramidal bump electrodes bonded onto the pad electrodes of the semiconductor chip away from the base.

According to the invention, the pyramidal bump electrodes formed on the semiconductor chip has a quadrilateral pyramid shape or the like. A pattern opposite to the pad electrodes on the semiconductor chip is formed on a separate base having a particular crystal orientation plane, and transferred to the pad electrodes on the semiconductor chip to form the pyramidal bump electrodes of a quadrilateral pyramid shape or the like for electrical connection to the outside. Thus, the semiconductor device can be produced at low cost by simplified manufacturing processes without exposing the good semiconductor chip to severe conditions.

The base having a particular crystal orientation plane is a silicon substrate having a crystal orientation plane of <100>.

Thus, the above mounting structures enable the electrodes of the semiconductor device to be precisely mounted at a high density on a substrate with no height dispersion and without causing any defective conduction at the time of connection to the substrate.

Moreover, the above mounting structures enable the electrodes of the semiconductor device to be easily mounted at a high density and at low cost on a substrate with no height dispersion and without causing any defective conduction at the time of connection to the substrate.

Furthermore, the above mounting structures enable the novel pyramidal bump electrodes to be bonded by simplified manufacturing processes onto the pad electrodes of the semiconductor chip to produce the semiconductor device at low cost.

BEST MODE FOR CARRYING OUT THE INVENTION

Embodiments of the invention will be described with reference to the accompanying drawings.

Figure 1:
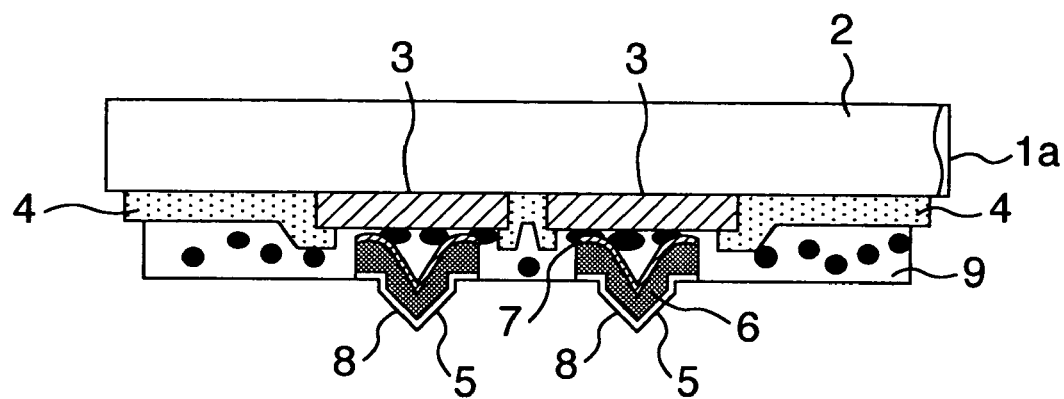
FIG. 1 is a cross-sectional view of the first embodiment of a semiconductor device according to the invention.

A structure 1*a* of the first embodiment of the semiconductor device that can be mounted with high precision on a substrate such as a printed wiring board will be described with reference to FIGS. 1~3. FIG. 1 is a cross-sectional view of the first embodiment of the semiconductor device that can be mounted with high precision onto a substrate such as a printed wiring board. There are shown the structure 1*a* as the first embodiment of the semiconductor device, a semiconductor chip 2, a large number of pad electrodes 3 arranged in two dimensions on the semiconductor chip 2, a protective film 4 formed on the semiconductor chip 2 with the pad electrodes 3 exposed, pyramidal bump electrodes 5 formed on the pad electrodes 3 in order that the semiconductor chip 2 can be mounted with high precision on a substrate 21 such as a printed wiring board, and an anisotropic conduction sheet 9 for electrically bonding the pad electrodes 3 and the pyramidal bump electrodes 5. The pyramidal bump electrodes 5 have a pyramid shape such as a quadrilateral pyramid with a sharp tip and with one side of the bottom, for example, 10~60 µm long in order to satisfy high-density mounting conditions (pitches less than 0.2 mm, for example, 0.13 mm or 0.1 mm, and further less than 0.1 mm). The pyramidal bump electrodes each are formed of a plated film 6 of a hard element such as nickel Ni as a base material, a plated film 7 of gold or the like as the surface facing the pad electrode 3, and a plated film 8 of gold or the like as the surface to be connected to a terminal 22 formed on the substrate 21. Of course, one side of the bottom of the quadrilateral pyramid or the like can be made longer than 60 µm. The pyramidal bump electrodes 5 can be produced at a high density without irregular dimensions (particularly heights) as will be described later. The pyramidal bump electrodes 5 are electrically connected to the pad electrodes 3 formed on the semiconductor chip 2 by thermal compression at a temperature of 200° C.~300° C. with the anisotropic conduction sheet 9 interposed therebetween. The pyramidal bump electrodes 5 of a quadrilateral pyramid shape are formed by photolithographically patterning on a mold material so as to have a precise size at accurate positions. Thus, the pyramidal bump electrodes 5 can be located precisely to oppose the pad electrodes 3 formed on the semiconductor chip 2 and they can be formed at a high density with the sizes (particularly heights) not dispersed.

The terminals 22 formed on the substrate 21 such as a printed wiring board on which the pyramidal bump electrodes 5 that constitute the semiconductor device 1*a* are mounted, are connected to wiring conductors 23 on the substrate 21. The wiring conductors 23 are extended around within the substrate in order to be connected to other semiconductor devices and other circuits. The terminals 22 on the substrate 21 are made of the same low-resistance material of chromium Cr or the like as the wiring conductors. A Ni-plated film or the like that is not subject to be oxidized and further a gold-plated film or the like may be formed on the surface of the Cr material.

Figure 2:
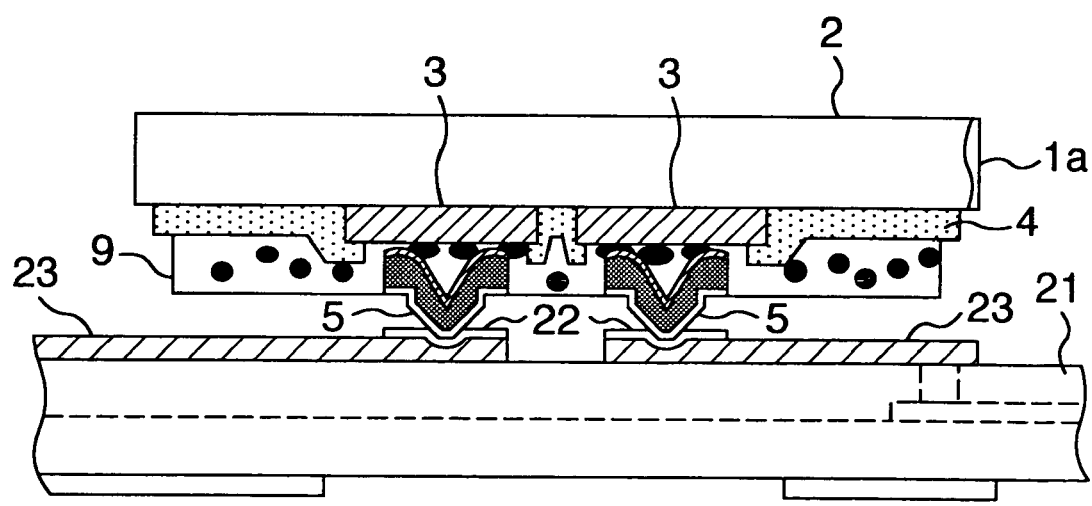
FIG. 2 is a cross-sectional view of an example of the device mounted on a substrate in the first embodiment of a semiconductor device according to the invention.

The pyramidal bump electrodes 5 constituting the semiconductor device 1*a* and the terminals on the substrate 21 are bonded by thermal compression or soldering as shown in FIG. 2. In addition, as shown in FIG. 3, an adhesive agent or adhesive sheet 25 may be interposed between the surface of the substrate 21 and the anisotropic conduction sheet 9 of the semiconductor device 1*a* so that the semiconductor device 1*a* can be securely mounted on the substrate 21 with the pyramidal bump electrodes 5 electrically connected to the terminals 22.

Figure 4:
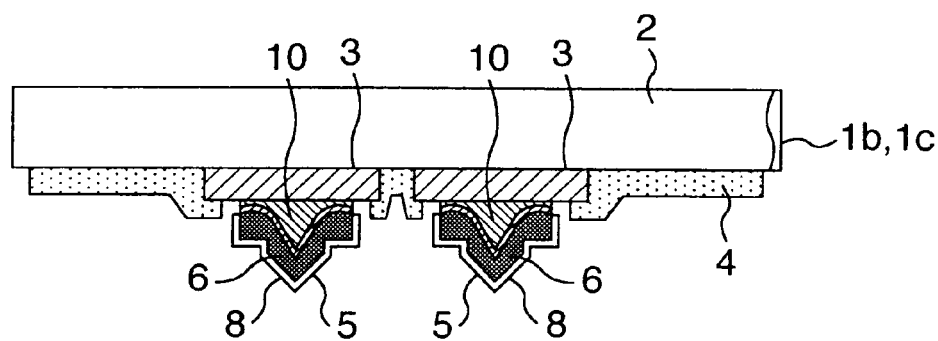
FIG. 4 is a cross-sectional view of the second embodiment of a semiconductor device according to the invention.

The second embodiment 1*b*, 1*c* of the semiconductor device that can be mounted at a high density on the substrate such as a printed wiring board will be described with reference to FIGS. 4~6. FIG. 4 is a cross-sectional view of the second embodiment of the semiconductor device that can be mounted at a high density on the substrate such as a printed wiring board. Reference numerals 1*b*, 1*c* represent the structure of the second embodiment. The second embodiment 1*b*, 1*c* of the semiconductor device of FIG. 4 is different from the first embodiment 1*a* of the semiconductor device of FIG. 1 in that the pyramidal bump electrodes 5 and the pad electrodes 3 formed on the semiconductor chip 2 are bonded by a different way. While the pyramidal bump electrodes 5 and the pad electrodes 3 are bonded through the anisotropic conduction sheet 9 by thermal compression in the first embodiment 1*a* of the semiconductor device, the pyramidal bump electrodes 5 and the pad electrodes 3 are connected through an alloy 10 of gold and tin by thermal compression in the second embodiment 1*b*, 1*c*. Even in the second embodiment 1*b*, 1*c*, the pyramidal bump electrodes 5 of a quadrilateral pyramid shape are formed at a high density without irregular sizes (particularly heights) and located precisely to oppose the pad electrodes 3 on the semiconductor chip 2 like the first embodiment 1*a*.

Figure 3:
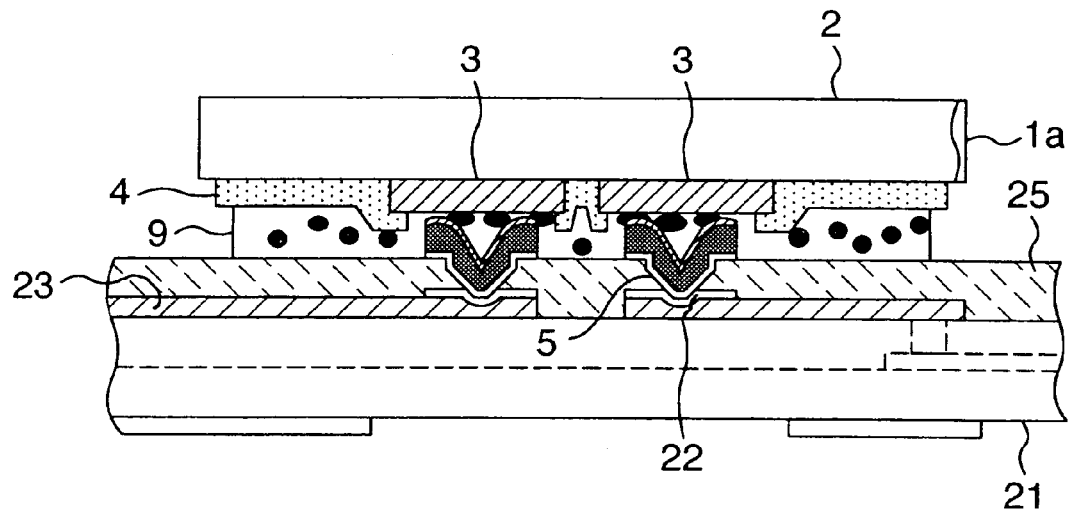
FIG. 3 is a cross-sectional view of another example of the device mounted on a substrate in the first embodiment of a semiconductor device according to the invention.
Figure 5:
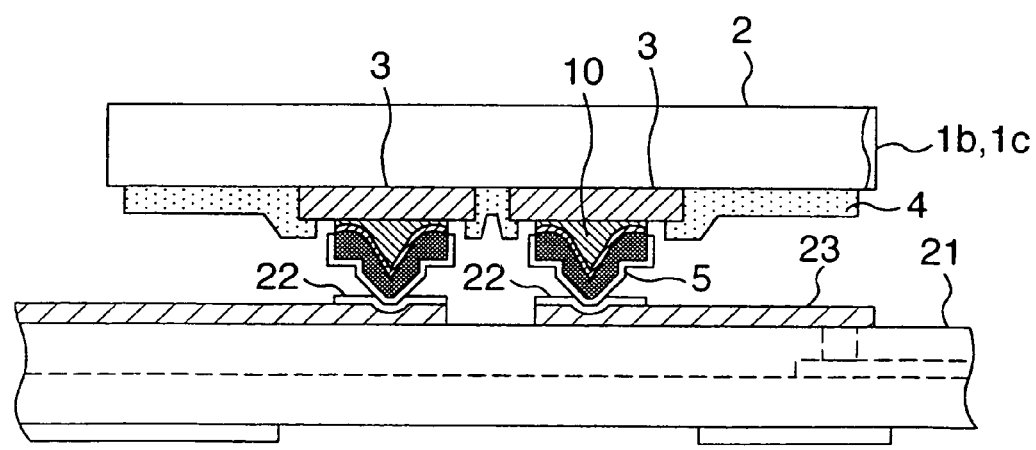
FIG. 5 is a cross-sectional view of an example of the device mounted on a substrate in the second embodiment of a semiconductor device according to the invention.
Figure 6:
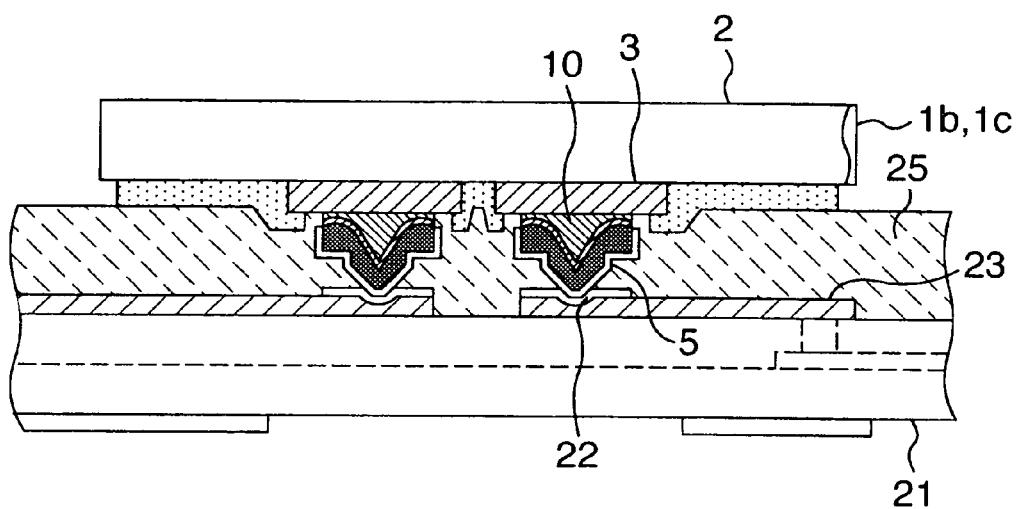
FIG. 6 is a cross-sectional view of another example of the device mounted on a substrate in the second embodiment of a semiconductor device according to the invention.

The semiconductor device 1*b*, 1*c* constructed as in FIG. 4 is mounted on the substrate 21 such as a printed wiring board as illustrated in FIGS. 5 and 6 like FIGS. 2 and 3. The pyramidal bump electrodes 5 constituting the semiconductor device 1*b*, 1*c* and the terminals 22 formed on the substrate 21 are bonded by thermal compression or soldering as shown in FIG. 5. In addition, as illustrated in FIG. 6, the adhesive agent or adhesive sheet 25 is interposed between the surface of the substrate 21 and the pad electrodes 3, protective film 4 of the semiconductor device 1b, 1c so that the semiconductor device 1b, 1c can be securely mounted on the substrate 21 with the pyramidal bump electrodes electrically connected to the terminals 22.

Thus, according to the first and second embodiments of the invention, there is no need to prepare tools for supplying and arranging a large number of solder balls as compared with the prior art in which a large number of pad electrodes 3 and a large number of terminals 22 formed on the substrate 21 are connected to each other by a large number of solder balls. In addition, since a large number of solder balls of which the diameters are dispersed are not used, the connection between the pad electrodes 3 and the terminals 22 on the substrate 21 can be satisfactorily made by the pyramidal bump electrodes 5 that are uniformly mounted at a high density over the whole area. That is, according to the first and second embodiments, a large number of contacts with no height dispersion can be precisely provided at a high density, or at a pitch of less than 0.2 mm, for example, 0.13 mm or 0.1 mm or even at a pitch of less than 0.1 mm. In other words, high-density mounting can be achieved at low cost without using tools or the like.

Figure 7:
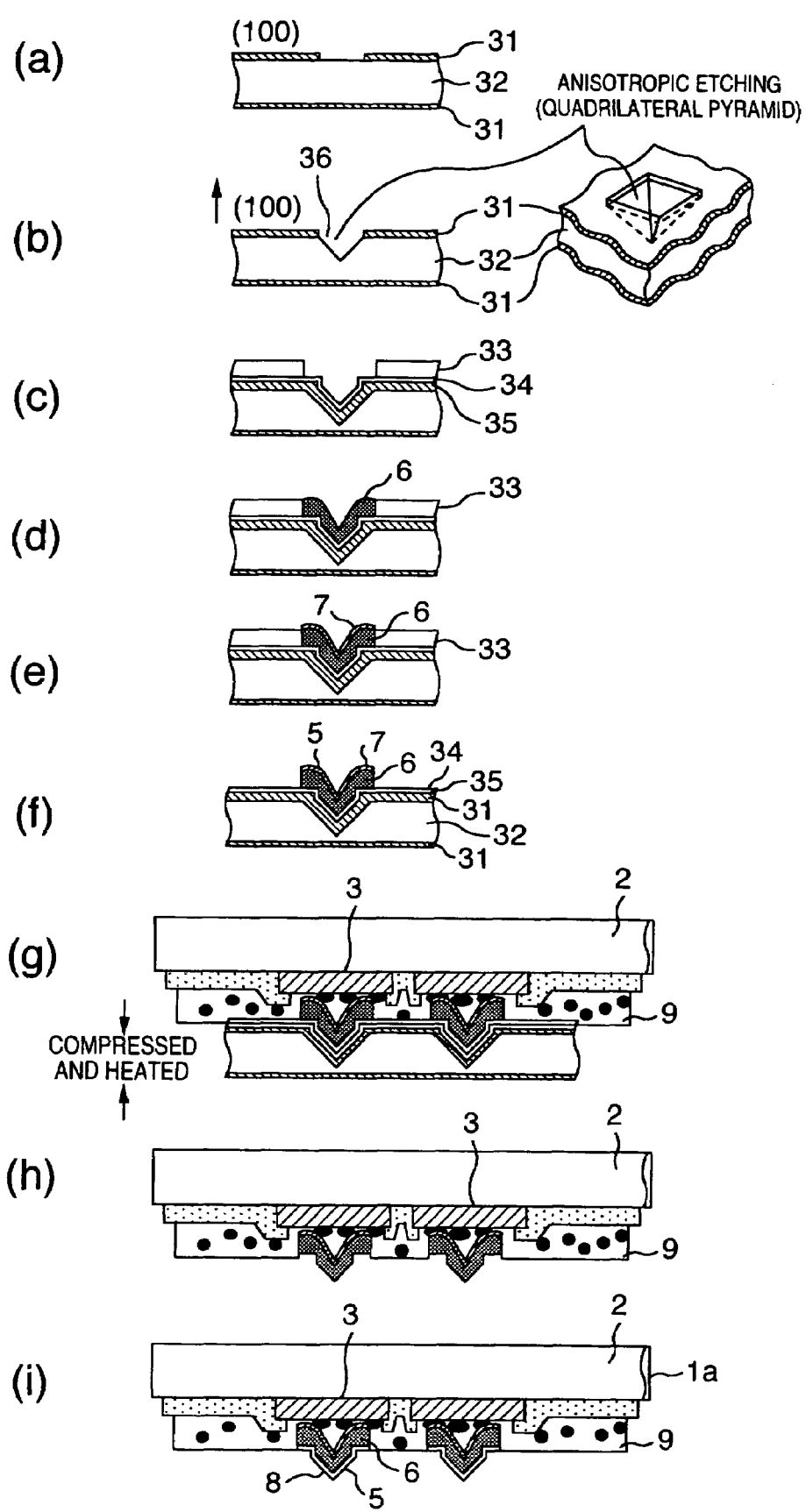
FIG. 7 is a flow diagram of the first embodiment of a method of producing the first embodiment of the semiconductor device according to the invention.
Figure 8:
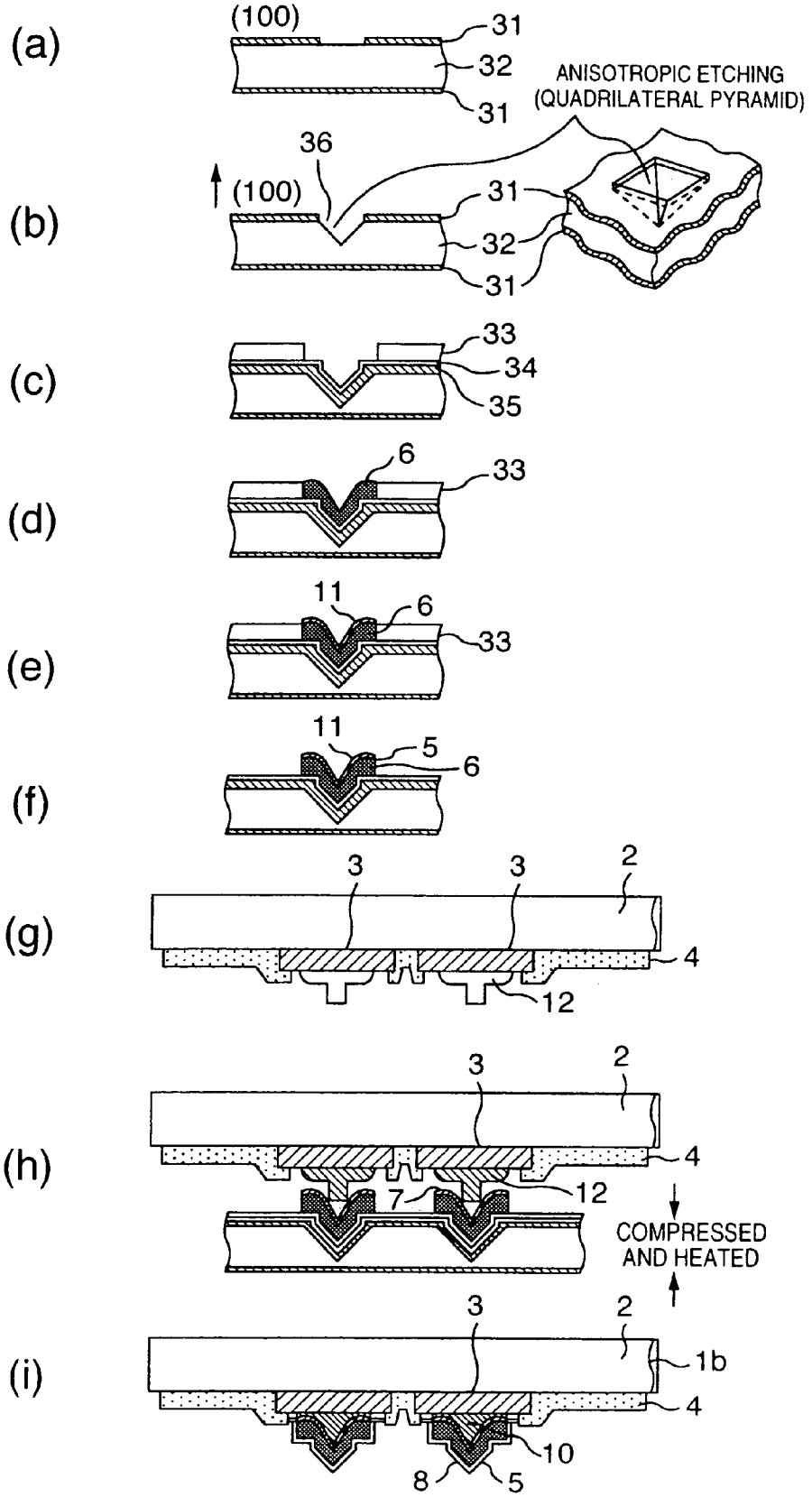
FIG. 8 is a flow diagram of the second embodiment of a method of producing the second embodiment of the semiconductor device according to the invention.
Figure 9:
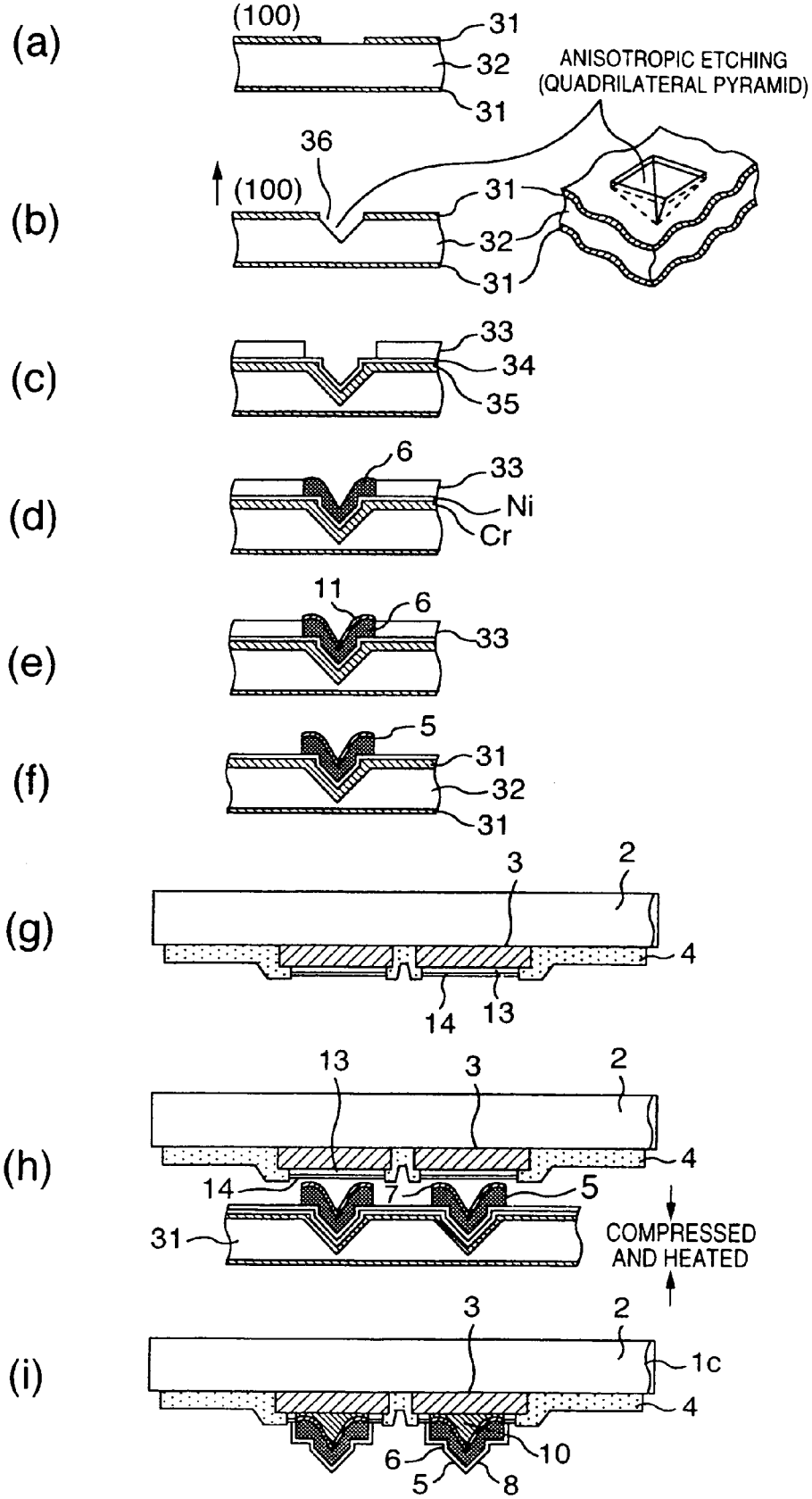
FIG. 9 is a flow diagram of the third embodiment of a method of producing the second embodiment of the semiconductor device according to the invention.

With reference to FIGS. 7, 8 and 9, a description will be made of a method of forming a semiconductor device by forming the pyramidal bump electrodes 5 of a quadrilateral pyramid shape with a sharp tip and bonding the pyramidal bump electrodes 5 to the pad electrodes 3 formed on the semiconductor chip 2, thus producing a semiconductor device.

The first embodiment of the method will be described with reference to FIG. 7.

How to form the quadrilateral pyramid shape will be explained first. A silicon base material 32 having a crystal orientation of <100> plane is thermally oxidized to form a silicon dioxide film 31 of about 0.5 μm thickness on both sides, or so that a silicon wafer substrate with a particular crystal orientation plane is produced which has the silicon dioxide film 31 provided on both surfaces. As shown in FIG. 7(a), the thermally oxidized film 31 on one side of the silicon substrate is etched at proper positions by photo-etching to form such a pattern as to oppose the pad electrodes 3 of the semiconductor chip 2. Then, as shown in FIG. 7(b), the silicon substrate with the silicon oxide films is anisotropically etched through the patterned thermally-oxidized film 31 with an alkaline etchant to form etched holes (of a quadrilateral pyramid shape) 36 surrounded by <111> plane thereon. In other words, the etched holes (of a quadrilateral pyramid shape) 36 surrounded by <111> plane are formed on the silicon substrate by anisotropic etching. Thereafter, the patterned thermally oxidized film on the silicon substrate is removed, and a new silicon dioxide film of about 0.5 μm is deposited over the substrate by thermally oxidizing the <111> plane of the silicon substrate in a wet oxygen atmosphere. As shown in FIG. 7(c), a multi-layered metal film formed of a plated feeding film (Cr film) 35 and a plated feeding film (Ni film) 34 is also deposited over the surface of the silicon substrate. Then, a pattern 33 of an organic material opposing the holes is deposited thereon in order to allow later deposition of a plated film of the quadrilateral pyramid shape that serves as the tip metal of the pyramid. As shown in FIG. 7(d), the plated film 6 of hard Nickel Ni or soft copper Cu or the like is filled up by electroplating in the openings of the pattern 33 of an organic material. After the above processes, the substrate is rinsed and dried, and then the gold plated film 7 is deposited only on the film 6 as shown in FIG. 7(e) so that the plated film 6 of hard Ni or the like can be prevented from being oxidized and can be surely connected later. In addition, as shown in FIG. 7(f), the pattern 33 of an organic material is peeled off with a resist exfoliating solution. In this way, the pyramidal bump electrodes 5 of a quadrilateral pyramid shape can be precisely produced on the silicon base.

A description will be made of how the pyramidal bump electrodes 5 of a quadrilateral pyramid shape formed on the silicon wafer base are connected to the pad electrodes 3 of the semiconductor chip 2. As shown in FIG. 7(g), the anisotropic conduction sheet 9 is interposed between the chip 2 and the silicon base while a number of pad electrodes 3 of the good semiconductor chip 2 are respectively aligned with a number of pyramidal bump electrodes 5 of a quadrilateral pyramid shape of the silicon base. These chip, sheet and base are heated and compressed so that the pyramidal bump electrodes and the pad electrodes can be bonded to each other in order to have the conductive particles of the anisotropic conduction sheet 9 held therebetween. Then, the lowest layer of the multi-layered metal films 35, 34 as the plated feeding films of a quadrilateral pyramid shape formed in the holes of the silicon base, or the chromium film 35 close to the silicon base is removed with a selective etchant that does not corrode the other metals. Alternatively, the thermally oxidized film 31 close to the metal film 34 and in contact with the silicon base is removed with a selective etchant that does not corrode the other metals. Then, the chromium and copper films are selectively etched away so that the pyramidal bump electrodes 5 of a quadrilateral pyramid shape can be transferred from the silicon base to the semiconductor chip as shown in FIG. 7(h). After the chip 3 with the pyramidal bump electrodes mounted is rinsed, the gold plated film 8, as shown in FIG. 7(i), is deposited on the surfaces of the separated pyramidal bump electrodes (convex pattern) of a quadrilateral pyramid shape in order to facilitate the good electrical connection to the outside. The constituents and conditions of the etchants for the chromium film and thermally oxidized film are given below.

The constituents and conditions of the etchant for the chromium film:

| | |
|---|---|
| Aluminium chloride with 6 crystallization water | 250 g/liter |
| Hydrochloric acid | 300 m liter/liter |
| Water | Amount to make one liter |
| Conditions | |
| Liquid temperature | 50° C. |
| Time | Necessary for all chromium to dissolve |

The constituents and conditions of the etchant for the thermally oxidized film:

| | |
|---|---|
| 50%-fluorine acid | 1 |
| 40%-ammonium fluoride | 7 volume ratio |
| Conditions | |
| Liquid temperature | room temperature |
| Time | Necessary for all thermally oxidized film to dissolve |

Thus, the pyramidal bump electrodes 5 of a quadrilateral pyramid shape bonded on a large number of pad electrodes of the good semiconductor chip 2 can be precisely provided in order to be connected to the outside. This enables the semiconductor chip 2 to be mounted on the substrate at a number of precisely arranged contacts with no height dispersion and with ease. Thus, the semiconductor device mounting can be performed at low cost. In other words, very high-precision mounting, or high-density mounting can be achieved by the production method of the first embodiment. In addition, since the holes 36 of a quadrilateral pyramid shape formed in the base 32 of silicon or the like are not broken after the pyramidal bump electrodes 5 of the quadrilateral pyramid shape are transferred to the pad electrodes 3 of the semiconductor chip 2, the silicon base 32 can be repeatedly used, thus leading to low cost.

The second embodiment of the invention will be described with reference to FIG. 8.

The production processes (a)~(d) in the second embodiment of FIG. 8 are the same as those (a)~(d) in the first embodiment of FIG. 7. After the nickel, Ni film 6 is filled up in the holes, the substrate is rinsed. Thereafter, as shown in FIG. 8(e), a tin, Sn plated film 11 is deposited only on the Ni plated film 6. Then, as shown in FIG. 8(f), the pattern 33 of an organic material is peeled off with a resist exfoliating solution. Thus, the pyramidal bump electrodes 5 of a quadrilateral pyramid shape can be precisely produced on the silicon base surface.

A description will be made of how to connect the projection electrodes 5 of a quadrilateral pyramid shape of the silicon wafer base surface to the pad electrodes of the semiconductor chip 2. As illustrated in FIG. 8(g), gold stud bumps 12 are previously formed in the contact holes of the semiconductor chip (on the pad electrodes 3 of the semiconductor chip 2) by wire bonding. As illustrated in FIG. 8(h), the good semiconductor chip 2 and the silicon base are heated and compressed while a number of pad electrodes 3 of the chip and a number of pyramidal bump electrodes 5 of a quadrilateral pyramid shape of the base are aligned with each other. In this case, when the chip and the base are heated at a temperature of 230° C. or above, the tin plated film 11 melts to react with the gold stud bumps 12. Thus the gold stud bumps 12 and the tin plated film 11 are reacted to form an alloy and so that the pyramidal bump electrodes and the pad electrodes can be bonded to each other by metallic bond. Then, in the same way as in the first embodiment, the lowest layer of the multi-layered feeding metal films 35, 34 plated on the silicon base surface in which the hole pattern of a quadrilateral pyramid shape is formed, or the metal film 35 close to the silicon base is dissolved and removed with a selective etchant that does not corrode the other metals, so that the pyramidal bump electrodes 5 of a quadrilateral pyramid shape can be separated and transferred from the silicon base surface to the semiconductor chip. After the semiconductor chip with the pyramidal electrodes is rinsed, the gold plated film 8 is deposited on the surfaces of the pyramidal bump electrodes (convex pattern) 5 in order to allow the good electrical connection to the outside as shown in FIG. 8(i).

While an alloy of gold and tin is used for the metallic bond in this embodiment, high-temperature solder may be used for the connection.

The pyramidal bump electrodes 5 of a novel quadrilateral pyramid shape are thus produced on the good semiconductor chip in order to be connected to the outside. The production of this semiconductor device 1b enables the semiconductor chip 2 to be precisely mounted on the substrate at a number of contacts with no height dispersion and with ease. Thus, the semiconductor device mounting can be performed at low cost. In other words, very high-precision mounting, or high-density mounting can be achieved by the production method of the second embodiment as well as by that of the first embodiment. In addition, since the holes 36 of a quadrilateral pyramid shape formed in the base 32 of silicon or the like are not broken after the pyramidal bump electrodes 5 of the quadrilateral pyramid shape are separated and transferred to the pad electrodes 3 of the semiconductor chip 2, the silicon base 32 can be repeatedly used, thus leading to low cost.

The third embodiment of the invention will be described with reference to FIG. 9. The production processes (a)~(f) shown in FIG. 9 in the third embodiment are the same as those (a)~(f) shown in FIG. 8 in the second embodiment. That is, After the hard nickel, Ni plated film 6 is filled up in the holes, the substrate is rinsed. Thereafter, as shown in FIG. 9(e), the tin, Sn plated film 11 is deposited only on the hard Ni plated film 6. Then, as shown in FIG. 9(f), the pattern 33 of an organic material is peeled off with a resist exfoliating solution. Thus, the pyramidal bump electrodes 5 of a quadrilateral pyramid shape can be formed in the same way as in the second embodiment. The pyramidal bump electrodes 5 of a quadrilateral pyramid shape can be precisely produced on the silicon base surface.

A description will be made of how to connect the projection electrodes 5 of a quadrilateral pyramid shape of the silicon wafer base surface to the pad electrodes 3 of the semiconductor chip 2. The bottom and side walls of the contact holes (the pad electrodes 3 of the semiconductor chip 2) of the semiconductor chip are generally made of an aluminum alloy. Thus, as shown in FIG. 9(g), an electroless nickel plated film 13 is deposited by plating on the surface of the walls of the contact holes (pad electrodes 3). In addition, a gold plated film 14 is further deposited thereon. That is, the surfaces of the pad electrodes 3 of the semiconductor chip 2 are changed into the nickel/gold surfaces. Then, as shown in FIG. 9(h), the good semiconductor chip 2 with a number of pad electrodes 3 and the silicon base with a number of projection electrodes 5 are heated and compressed against each other at a temperature of 230° C. or above after the pad electrodes and the pyramidal bump electrodes of a quadrilateral pyramid shape are aligned with each other. The tin plated film 11 melts to react with the gold plated film 14, producing an alloy of gold and tin with the result that the pyramidal bump electrodes 5 are bonded to the pad electrodes 3 by metallic bond. Then, in the same way as in the first and second embodiments, the lowest layer of the multi-layered feeding metal films 35, 34 plated on the silicon base surface in which the hole pattern of a quadrilateral pyramid shape is formed, or the metal film 35 close to the silicon base is dissolved and removed with a selective etchant that does not corrode the other metals, so that the pyramidal bump electrodes 5 of a quadrilateral pyramid shape can be separated and transferred from the silicon base surface to the semiconductor chip. After the semiconductor chip with the pyramidal bump electrodes is rinsed, the gold plated film 8 is deposited on the surfaces of the pyramidal bump electrodes (convex pattern) 5 in order to allow the good electrical connection to the outside as shown in FIG. 9(i).

While an alloy of gold and tin is used for the metallic bond in this embodiment, high-temperature solder may be used for the connection.

The novel pyramidal bump electrodes 5 of a quadrilateral pyramid shape are thus produced on the good semiconductor chip in order to be connected to the outside. The production of this semiconductor device 1c enables the semiconductor chip 2 to be precisely mounted on the substrate at a number of contacts with no height dispersion and with ease. Thus, the semiconductor device mounting can be performed at low cost. In other words, very high-precision mounting, or high-density mounting can be achieved by the production method of the third embodiment as well as by that of the first and second embodiments.

The present invention is not limited to the above embodiments. The same technical idea as the invention can be applied to the case in which a plurality of pyramidal bump electrodes of a quadrilateral pyramid shape are bonded to other connection pads that are electrically connected to the pad electrodes of the semiconductor chip, for example, to the so-called rewired metal electrodes arranged at a different pitch.

INDUSTRIAL APPLICABILITY

According to the invention, a semiconductor device capable of high density mounting with no height dispersion can be produced without causing any defective conduction when connected to a substrate. Also, according to the invention, a mounting structure of the semiconductor device for facilitating high density mounting at low cost with no height dispersion can be realized without causing any defective conduction when connected to a substrate.

Moreover, according to the invention, novel pyramidal bump electrodes are bonded by simplified manufacturing processes to the pad electrodes of a semiconductor chip to produce a semiconductor device at low cost. In other words, novel pyramidal bump electrodes of a quadrilateral pyramid shape for electrical connection to the outside can be precisely bonded onto the pad electrodes arranged at a high density on a semiconductor chip, thus enabling the manufacturing processes to be simplified and the mass productivity to be improved. Particularly in a method of bonding novel pyramidal bump electrodes of a quadrilateral pyramid shape onto the pad electrodes arranged at a high density on a semiconductor chip, the semiconductor device can be produced at low cost by simplified manufacturing processes without exposing the good semiconductor chip to severe conditions.

Thus, according to the invention, a semiconductor device for facilitating high density mounting at low cost can be produced without causing any defective conduction when connected to a substrate.

The invention claimed is:

1. A method of producing a semiconductor device comprising the steps of:
    forming a plurality of pyramid-shaped bump electrodes of the semiconductor device; and
    connecting the pyramid-shaped bump electrodes to pad electrodes of the semiconductor device;
    wherein said step of forming the plurality of pyramid-shaped bump electrodes includes:
    a step of forming pyramid-shaped etched holes by anisotropically etching a base material having a crystal orientation, and
    a step of filling up the etched pyramid-shaped holes by plating a metal to form the pyramid-shaped bump electrodes, wherein a shape of the pyramid-shaped bump electrodes is identical to a shape of the etched pyramid-shaped holes; and
    wherein the step of connecting the pyramid-shaped bump electrodes to the pad electrodes includes:
    a step of attaching the base of the pyramid-shaped bump electrodes to the pad electrodes, and
    a step of transferring the pyramid-shaped bump electrodes to the pad electrodes,
    wherein the pyramid-shaped bump electrodes are each formed by a conductive material,
    wherein the pyramid-shaped bump electrodes have a shape of a pyramid, which is a figure having a square base and four triangle-shaped sides, and
    wherein the four triangle-shaped sides meet at a common point.

2. A method of producing a semiconductor device according to claim 1,
    wherein between said step of forming etched holes and said step of filling up the etched holes, further includes
    a step of forming a primary film of the same material as the metal for said plating of the metal on said base material having a crystal orientation and on a side surface of each of said etched holes, thereby filling up the etched holes by plating the metal by using said primary film.

3. A method of producing a semiconductor device according to claim 2,
    wherein in said step of forming a primary film, a Cr film is formed as said primary film for metal plating, and then a Ni film is formed on the Cr film.

4. A method of producing a semiconductor device according to claim 3,
    wherein in said step of connecting said pyramid-shaped bump electrodes to pad electrodes of the semiconductor device, said pyramid-shaped bump electrodes are transferred from the base material having the crystal orientation to the pad electrodes by removing said Cr film.

5. A method of producing a semiconductor device according to claim 1,
    wherein before said step of forming said etched holes, further includes
    a step of forming a first pattern having opening portions at positions corresponding to the etched holes by etching a first oxidized film formed on said base material having the crystal orientation, and
    a step of forming said etched holes by using the first pattern as a mask.

6. A method of producing a semiconductor device according to claim 1,
    wherein said step of forming the plurality of pyramid-shaped bump electrodes includes;
    a step of forming a first pattern having opening portions at positions corresponding to the etched holes by etching a first oxidized film formed on said base material having the crystal orientation, and
    a step of forming said etched holes by using the first pattern as a mask,
    a step of removing the first oxidized film,
    a step of forming a second oxidized film anew on the etched holes, and
    a step of filling up the etched holes by plating a metal.

7. A method of producing a semiconductor device according to claim 6,
    wherein after said step of filling up the etched holes by plating a metal, further includes a step of forming a gold plated film on the metal plated film.

8. A method of producing a semiconductor device according to claim 6,
    wherein in said step of filling up the etched holes by plating a metal, Ni is plated as said metal to fill up the etched holes.

9. A method of producing a semiconductor device according to claim 6,
    wherein in said step of filling up the etched holes by plating a metal, Cu is plated as said metal to fill up the etched holes.

10. A method of producing a semiconductor device according to claim 6,
wherein after said step of connecting the pyramid-shaped bump electrodes to pad electrodes of the semiconductor device, further includes a step of forming a gold film on a surface of the pyramid-shaped bump electrodes.

11. A method of producing a semiconductor device according to claim 6,
wherein in said step of connecting said pyramid-shaped bump electrodes to pad electrodes of the semiconductor device, after transferring the pyramid-shaped bump electrodes from the base material having the crystal orientation to the pad electrodes, a step is further included to form a gold film on the surface of the pyramid-shaped bump electrodes.

12. A method of producing a semiconductor device according to claim 1,
wherein after said step of filling up the etched holes by plating a metal, further includes a step of forming a gold plated film on the metal plated film.

13. A method of producing a semiconductor device according to claim 1,
wherein in said step of filling up the etched holes by plating a metal, Ni is plated as said metal to fill up the etched holes.

14. A method of producing a semiconductor device according to claim 1,
wherein in said step of filling up the etched holes by plating a metal, Cu is plated as said metal to fill up the etched holes.

15. A method of producing a semiconductor device according to claim 1,
wherein after said step of connecting the pyramid-shaped bump electrodes to pad electrodes of the semiconductor device, further includes a step of forming a gold film on a surface of the pyramid-shaped bump electrodes.

16. A method of producing a semiconductor device according to claim 1,
wherein in said step of connecting said pyramid-shaped bump electrodes to pad electrodes of the semiconductor device, after transferring the pyramid-shaped bump electrodes from the base material having the crystal orientation to the pad electrodes, a step is further included to form a gold film on the surface of the pyramid-shaped bump electrodes.

17. A method of producing a semiconductor device according to claim 1,
wherein in said step of connecting said pyramid-shaped bump electrodes to pad electrodes of the semiconductor device, said pyramid-shaped bump electrodes and the pad electrodes of the semiconductor device are thermally compressed at 200° C. to 300° C., and the pyramid-shaped bump electrodes and the pad electrodes of the semiconductor device are electrically connected through conductive particles connected to an anisotropic conduction sheet.

18. A method of producing a semiconductor device according to claim 1,
wherein in said step of connecting the pyramid-shaped bump electrodes to pad electrodes of the semiconductor device, gold stud bumps formed on the pad electrodes of said semiconductor device and the pyramid-shaped bump electrodes are thermally compressed thereby connecting by forming an alloy.

19. A method of producing a semiconductor device according to claim 1,
wherein in said step of connecting the pyramid-shaped bump electrodes to pad electrodes of the semiconductor device, a Ni film and a gold film formed on the pad electrodes of the semiconductor device, and the pyramid-shaped bump electrodes are thermally compressed thereby connecting by forming an alloy.

20. A method of producing a semiconductor device according to claim 1,
wherein the plurality of pyramid-shaped bump electrodes is separated from one another at least after the step of connecting the pyramid-shaped bump electrodes to pad electrodes of the semiconductor device.

21. A method of producing a semiconductor device according to claim 1, further including a step of removing the base material from the pyramid-shaped bump electrodes after the step of connecting the pyramid-shaped bump electrodes to pad electrodes of the semiconductor device.

22. A method of producing a semiconductor device according to claim 1,
wherein each of the pyramid-shaped bump electrodes keeps its pyramid shape after the step of connecting pad electrodes of the semiconductor device.

23. A method of producing a semiconductor device according to claim 1,
wherein each tip of the pyramid-shaped bump electrodes is bonded to a terminal formed on a substrate after the step of connecting the pyramid-shaped bump electrodes to pad electrodes of the semiconductor device.

24. A method of producing a semiconductor device according to claim 23,
wherein said each tip of the pyramid-shaped bump electrodes is thermally compressed to the terminal formed on the substrate.

25. A method of producing a semiconductor device according to claim 23,
wherein said each tip of the pyramid-shaped bump electrodes is soldered to the terminal formed on the substrate.

26. A method of producing a semiconductor device according to claim 23, wherein the terminal is provided on a wiring conductor formed on a substrate.

27. A method of producing a semiconductor device comprising the steps of:
forming a plurality of pyramid-shaped bump electrodes of the semiconductor device; and
connecting the pyramid-shaped bump electrodes to pad electrodes of the semiconductor device;
wherein said step of forming the plurality of pyramid-shaped bump electrodes includes:
a step of forming a first pattern having openings at positions corresponding to etched holes by etching a first oxidized film formed on a surface of a base material having a crystal orientation,
a step of forming said etched holes by using the first pattern as a mask,
a step of removing the first oxidized film,
a step of forming a second oxidized film anew on the etched holes,
a step of forming a plated feeding film on the base material having the crystal orientation and on a side surface of each of the etched holes,
a step of forming a second pattern of an organic material on the base material having the crystal orientation so that the etched holes are not covered, a step of filling up the etched holes by plating a metal film on the plated film on the plated feeding film, wherein a shape of the pyramid-shaped bump electrodes is identical to a shape of the etched holes, a step of forming a gold plated film on the metal film, and a step of removing the second pattern of the organic material; and wherein the step of connecting the pyramid-shaped bump electrodes to the pad electrodes includes:

a step of attaching the base of the pyramid-shaped bump electrodes to the pad electrodes, and a step of transferring the pyramid-shaped bump electrodes to the pad electrodes, wherein the pyramid-shaped bump electrodes are each formed by a conductive material, wherein the pyramid-shaped bump electrodes have a shape of a pyramid, which is a figure having a square base and four triangle-shaped sides, and wherein the four triangle-shaped sides meet at a common point.

28. A method of producing a semiconductor device comprising the steps of:

forming a plurality of pyramidal bump electrodes of the semiconductor device; and connecting the pyramidal bump electrodes to pad electrodes of the semiconductor device;

wherein said step of forming the plurality of pyramidal bump electrodes includes:

a step of forming pyramidal etched holes by anisotropically etching a base material having a crystal orientation, and a step of filling up the etched pyramidal holes by plating a metal to form the pyramidal bump electrodes, wherein a shape of the pyramidal bump electrodes is identical to a shape of the etched pyramidal holes; and wherein the step of connecting the pyramidal bump electrodes to the pad electrodes includes:

a step of attaching the base of the pyramidal bump electrodes to the pad electrodes, and a step of transferring the pyramidal bump electrodes to the pad electrodes, wherein the pyramidal bump electrodes are each formed by a conductive material, and wherein the pyramidal bump electrodes have a shape of a figure comprising a rectangular base and at least two triangle-shaped sides.

29. A method of producing a semiconductor device comprising the steps of:

forming a plurality of pyramidal bump electrodes of the semiconductor device; and connecting the pyramidal bump electrodes to pad electrodes of the semiconductor device;

wherein said step of forming the plurality of pyramidal bump electrodes includes:

a step of forming a first pattern having openings at positions corresponding to etched holes by etching a first oxidized film formed on a surface of a base material having a crystal orientation, a step of forming said etched holes by using the first pattern as a mask, a step of removing the first oxidized film, a step of forming a second oxidized film anew on the etched holes, a step of forming a plated feeding film on the base material having the crystal orientation and on a side surface of each of the etched holes, a step of forming a second pattern of an organic material on the base material having the crystal orientation so that the etched holes are not covered, a step of filling up the etched holes by plating a metal film on the plated film on the plated feeding film, wherein a shape of the pyramidal bump electrodes is identical to a shape of the etched holes, a step of forming a gold plated film on the metal film, and a step of removing the second pattern of the organic material; and wherein the step of connecting the pyramidal bump electrodes to the pad electrodes includes:

a step of attaching the base of the pyramidal bump electrodes to the pad electrodes, and a step of transferring the pyramidal bump electrodes to the pad electrodes, wherein the pyramidal bump electrodes are each formed by a conductive material, and wherein the pyramidal bump electrodes have a shape of a figure comprising a rectangular base and at least two triangle-shaped sides.

* * * * *